United States Patent [19]
Evans

[11] Patent Number: 6,046,923
[45] Date of Patent: Apr. 4, 2000

[54] CONTENT-ADDRESSABLE MEMORY ARCHITECTURE WITH COLUMN MUXING

[75] Inventor: Donald A. Evans, Allentown, Pa.

[73] Assignee: Lucent Technologies Inc., Murray Hill, N.J.

[21] Appl. No.: 09/229,184

[22] Filed: Jan. 13, 1999

[51] Int. Cl.[7] .................................................. G11C 15/00
[52] U.S. Cl. .................. 365/49; 365/230.06; 365/230.02
[58] Field of Search ................................ 365/49, 230.03, 365/230.06, 186, 230.02

[56] References Cited

U.S. PATENT DOCUMENTS

| | | | |
|---|---|---|---|
| 4,694,425 | 9/1987 | Imel | 365/49 |
| 4,723,224 | 2/1988 | Van Hulett et al. | 365/49 |
| 4,905,189 | 2/1990 | Brunolli | 364/900 |
| 5,226,009 | 7/1993 | Arimoto | 365/189.04 |
| 5,249,282 | 9/1993 | Segers | 395/425 |
| 5,561,638 | 10/1996 | Gibson et al. | 365/230.05 |
| 5,699,288 | 12/1997 | Kim et al. | 365/49 |

Primary Examiner—David Nelms
Assistant Examiner—Thong Le

[57] ABSTRACT

Content-addressable memory (CAM) is reconfigured using column muxing, such that, for example, for 2:1 column muxing, each pair of vertically adjacent cells in a conventional cell array is reconfigured as a pair of horizontally adjacent cells in the cell array of the present invention. This reconfiguration doubles the number of columns in the cell array of CAM memory having a given size, but reduces the number of rows by a factor of two. This two-fold reduction in the number of rows reduces the bit-line loading by a factor of two, thereby improving CAM performance. In addition, the sharing of search-data lines between columns in the cell array allows column support circuitry to be laid out within a two-column pitch, which affords a more efficient layout of this circuitry relative to prior-art CAM memory whose column support circuitry was laid out within a one-column pitch. The sharing of search-data lines also allows a more efficient layout for the cell array, resulting in array layout reductions greater than 20%. Moreover, column decoders can be used to halve the number of sense amplifiers needed in the column support circuitry, thereby further reducing the layout size for such circuitry.

13 Claims, 6 Drawing Sheets

CONTENT-ADDRESSABLE MEMORY ARCHITECTURE WITH COLUMN MUXING

BACKGROUND OF THE INVENTION

1. Field of the Invention

The present invention relates to computer memory architecture, and, in particular, to the architecture of content-addressable memory.

2. Description of the Related Art

Content-addressable memory (CAM) is a particular type of random access memory (RAM) that can be written to and read from like a standard RAM, but can also be searched for specific content. In particular, CAM memory can be searched for a set of consecutive CAM cells that have a specified string of data values. Typically, the size of the search string corresponds to the word length of the CAM memory, and the search is performed in parallel in all data words to output, if the string is found, the address of the CAM word where the string exists. In a typical CAM design, if the string exists in two or more CAM words, the search will identify only one of them (e.g., the one with the lowest address).

Figure 1:
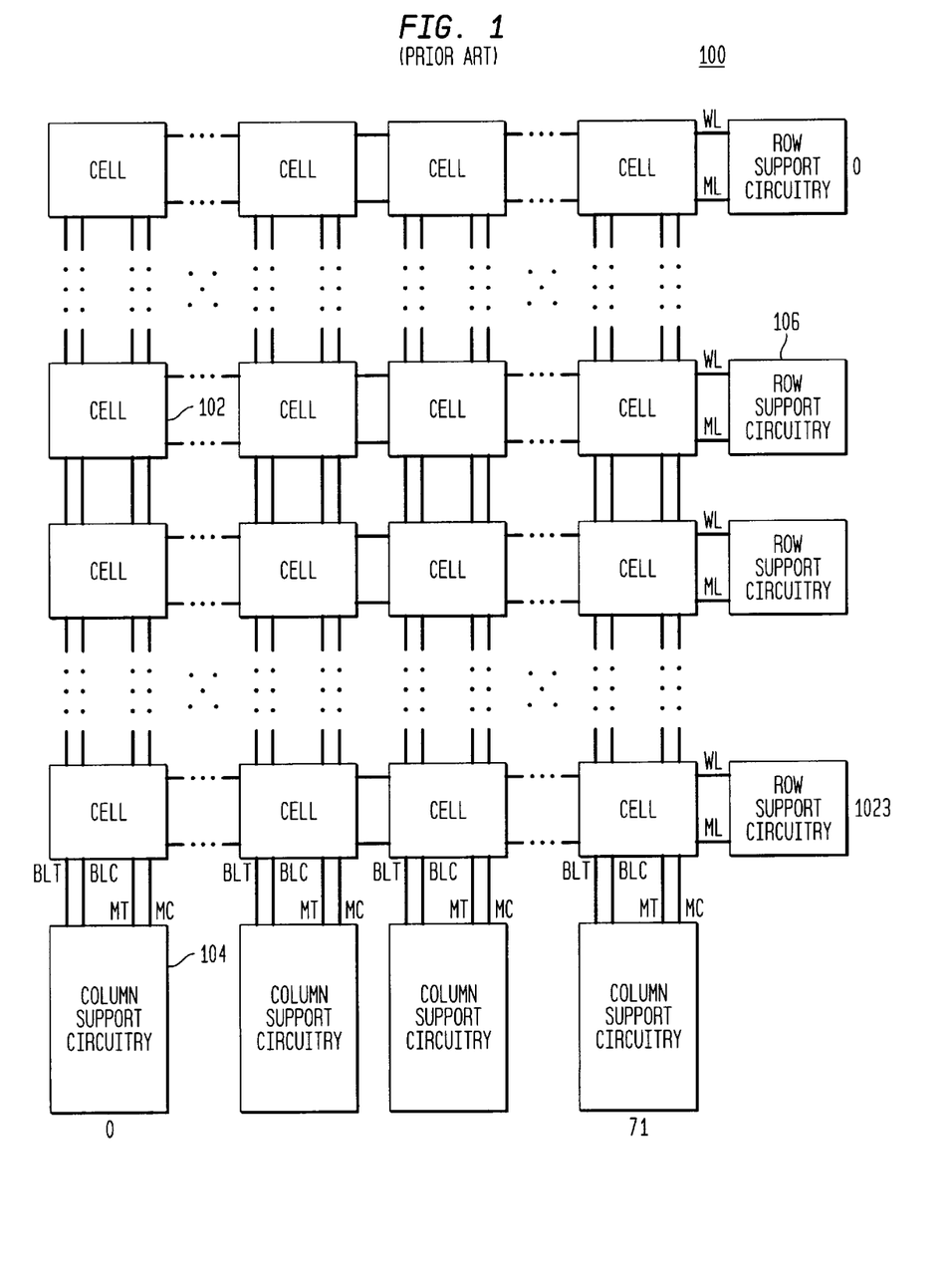
FIG. 1 shows a schematic diagram of the layout for a prior-art CAM memory supporting 1024 72-bit data words.

FIG. 1 shows a schematic diagram of the layout for a prior-art CAM memory 100 supporting 1024 72-bit data words. CAM memory 100 consists of a two-dimensional array of 72 columns and 1024 rows of CAM cells 102. For each column of cells in the array, CAM memory 100 also has a set of column support circuitry 104. Analogously, for each row of cells in the array, CAM memory 100 has a set of row support circuitry 106. Those skilled in the art will understand that the column and row support circuitry includes sense amps, input latches, output drivers, and other components needed to access the array of cells.

Figure 2:
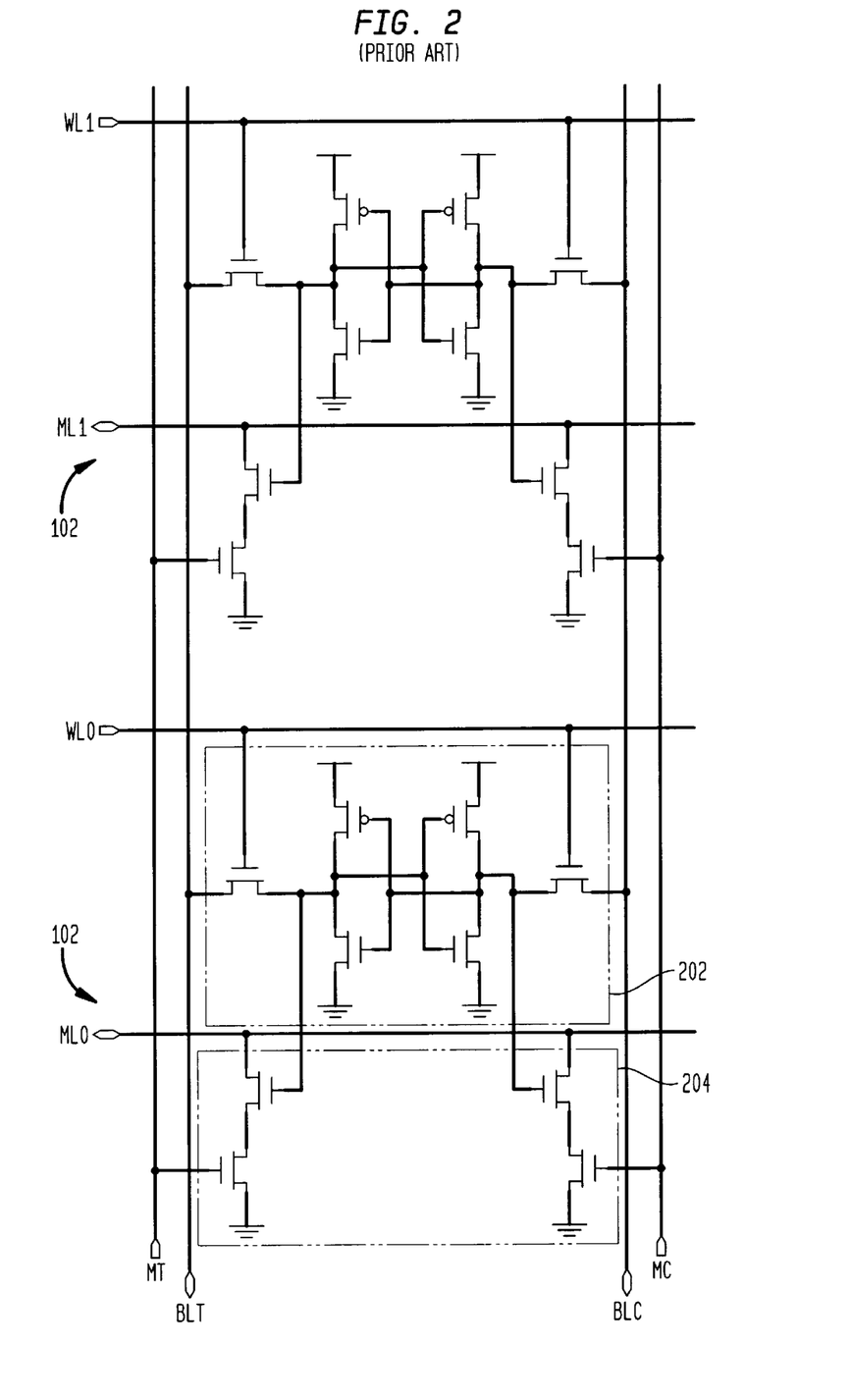
FIG. 2 shows a schematic diagram of the cell architecture of the CAM memory of FIG. 1.

FIG. 2 shows a schematic diagram of the cell architecture of CAM memory 100 of FIG. 1. In particular, FIG. 2 shows two vertically adjacent CAM cells 102 from one of the columns of the array of CAM memory 100 of FIG. 1. Each CAM cell comprises a conventional static RAM (SRAM) core cell 202 with six transistors: two cross-coupled inverters as a latch element and two access transistors for reading and writing. Each CAM cell also has XOR logic 204 comprising four additional devices (e.g., n-FETS) to support the content-searching function.

Access to each individual cell 102 is provided via corresponding word line WL, match line ML, true and complement bit lines BLT and BLC, and true and complement search-data lines MT and MC, where each line is either pre-charged high and active low or pre-charged low and active high, depending on the particular design. As indicated in FIGS. 1 and 2, each horizontal word line WL and each match line ML are shared by all of the cells in the corresponding row. Similarly, each vertical bit line BLT/BLC and each search-data line MT/MC are shared by all of the cells in the corresponding column.

Data bits are written into the individual cells of a word in parallel, by activating the word line WL corresponding to the appropriate row and pulsing the appropriate bit line BLT or BLC for each column. Pulsing bit line BLT stores a 1 in the corresponding cell, while pulsing bit line BLC stores a 0.

Similarly, data bits are read from the individual cells of a word in parallel, by activating the word line WL corresponding to the appropriate row. Each cell in that row will then drive either the BLT bit line or the BLC bit line depending on the value stored in the cell. If the stored bit value is 1, then the cell will drive the BLT bit line; otherwise, the cell will drive the BLC bit line indicating a stored bit value of 0.

Content searching is achieved using the match lines ML and the search-data lines MT and MC. In particular, one search-data line is driven active for each column in the array depending on the corresponding data bit in the search string. If the corresponding data bit in the search string is a 1, then the true search-data line MT is driven; otherwise, the complement search-data line MC is driven corresponding to a data bit of 0. If any cell in a word does not match its search input bit, then the corresponding match line ML will indicate that no match exists for that word. If, however, each bit in the search string matches each corresponding bit in a particular row of the array, then the corresponding match line ML will indicate that a match has been found at that word. Depending on the particular design, the pre-charge state of each match line will correspond to either a match condition or a no-match condition. In either case, each match line will be driven as necessary to indicate the appropriate search result for that word.

As shown in FIG. 1, CAM memory 100 requires only two horizontal lines (i.e., word line WL and match line ML) for each row of CAM cells 102, but four vertical lines (i.e., bit lines BLT and BLC and search-data lines MT and MC) for each column of CAM cells 102 in the array. As indicated in FIG. 1, in order to provide column support circuitry for four different vertical lines and have the pitch of the layout for that column support circuitry match the pitch of the cells, the height of that layout area must typically be relatively large. The narrowness of the available pitch results in a relatively inefficient layout for this column support circuitry.

Another problem with conventional CAM architecture, such as that of CAM memory 100 of FIGS. 1 and 2, relates to bit-line loading. Each row in a CAM memory device contributes capacitance and resistance to the bit lines used for reading and writing data bits from and to the individual cells, which increased impedance in turn decreases the speed of that data access. When a CAM memory has a relatively large number of words, such as the 1024 words of CAM memory 100, the bit-line loading resulting from all that impedance can result in unacceptably low CAM performance. For some applications, CAM performance requirements limit the size of the CAM cell array to less than 1024 rows (e.g., a maximum of 512 rows). As a result, the size of CAM memory, in terms of the number of words supported, may be limited for such applications.

SUMMARY OF THE INVENTION

The present invention is directed to content-addressable memory (CAM) having improved architecture. In particular, the CAM memory of the present invention uses column muxing to provide both more efficient layout and reduced bit-line loading. As a result, the CAM memory of the present invention has both smaller layout size and better performance than comparable prior-art CAM memory supporting the same amount of data.

In one embodiment, the present invention is an integrated circuit having a CAM, the CAM comprising (a) an array of CAM cells configured using column muxing such that a bit slice through the array corresponds to k columns of the array and each row of the array corresponds to k words, where k is an integer greater than one; (b) a set of row support circuitry for each row in the array; and (c) a set of column support circuitry for each k columns in the array. In a preferred embodiment, k is two and the array of CAM cells is configured using 2:1 column muxing.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 3:
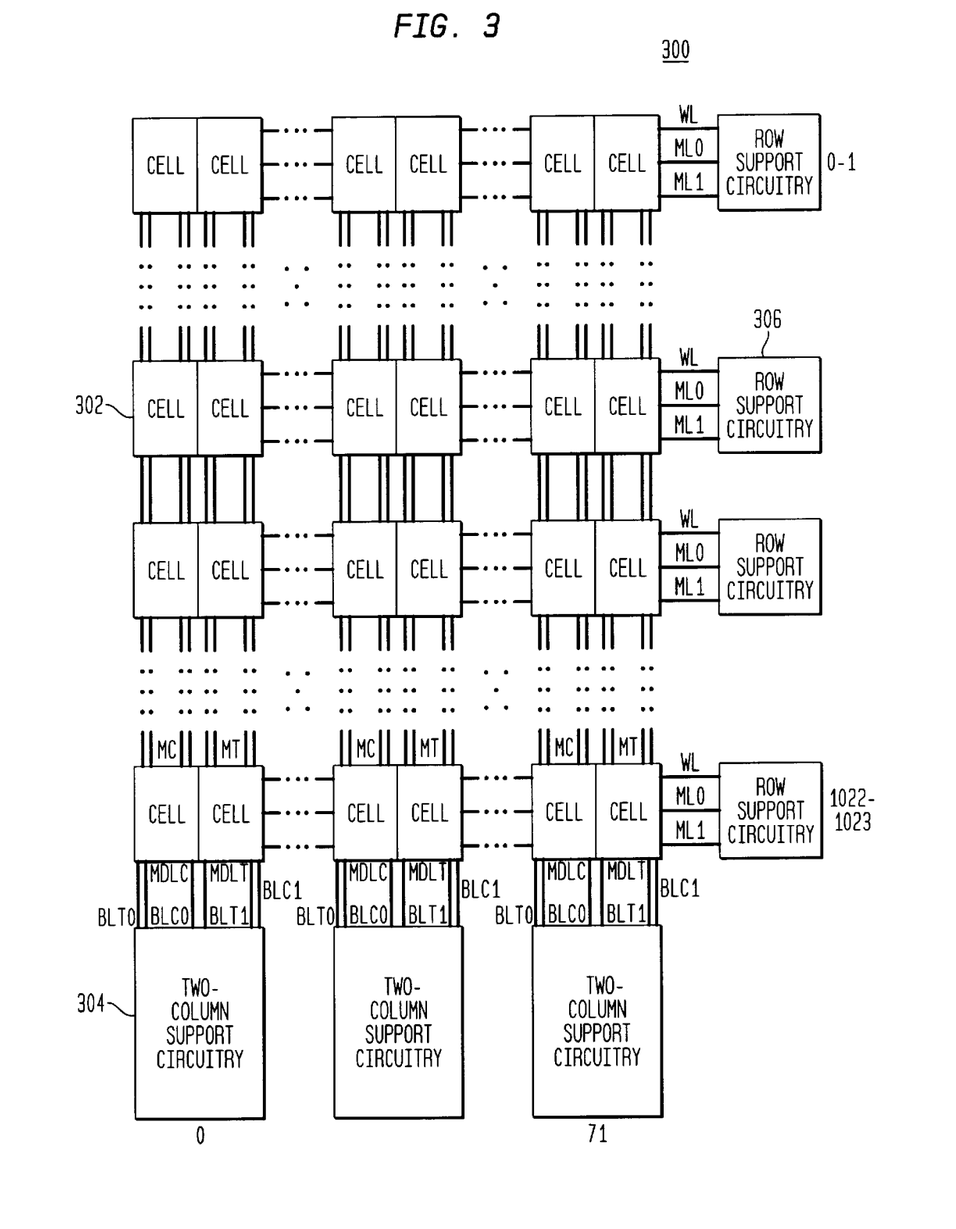
FIG. 3 shows a schematic diagram of the layout of a CAM memory supporting 1024 72-bit data words, according to one embodiment of the present invention.

FIG. 3 shows a schematic diagram of the layout of CAM memory 300, according to one embodiment of the present invention. Like CAM memory 100 of FIG. 1, CAM memory 300 supports 1024 72-bit data words. Unlike CAM memory 100, however, which has a two-dimensional array of 72 columns and 1024 rows of cells, the two-dimensional array of cells 302 in CAM memory 300 has 144 columns, but only 512 rows. This array configuration is achieved using 2:1 column muxing in which each pair of vertically stacked cells in CAM memory 100 is reconfigured as two horizontally placed cells in CAM memory 300. As such, each bit slice of the array contains two columns of array cells, but the array has only one row of cells for every two data words. Where the cell array in CAM memory 100 had N columns and E rows, the cell array in comparable CAM memory 300 has 2N columns and E/2 rows.

As was the case with CAM memory 100, for each row of cells in the array, CAM memory 300 has a set of row support circuitry 306. However, for each pair of columns of cells in the array, CAM memory 300 has a set of two-column support circuitry 304. This is different from CAM memory 100, which had a different set of circuitry for each column in the cell array.

Figure 4:
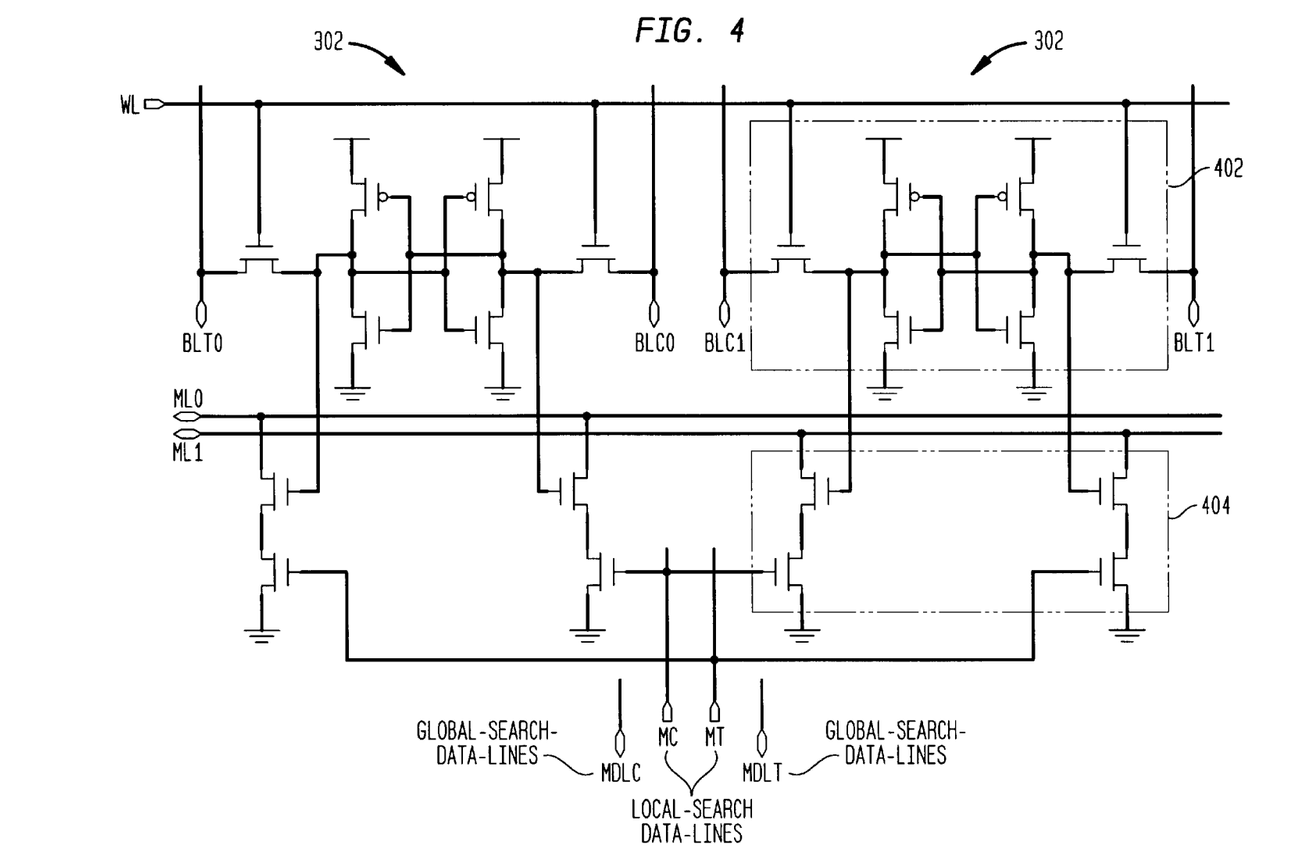
FIG. 4 shows a schematic diagram of the cell architecture of the CAM memory of FIG. 3.

FIG. 4 shows a schematic diagram of the cell architecture of CAM memory 300 of FIG. 3. In particular, FIG. 4 shows two horizontally adjacent CAM cells 302 from one of the rows of the array of CAM memory 300. The CAM cells of FIG. 4 correspond to the CAM cells of FIG. 2 reconfigured according to the 2:1 column muxing of the present invention. Note that, as a result of the 2:1 column muxing, the two CAM cells shown in FIG. 4 correspond to two different data words in CAM memory 300, even though they lie in the same row of cells in the array. As in the CAM cells of FIG. 2, each CAM cell 302 comprises a conventional six-transistor SRAM core cell 402 for reading and writing data. Each CAM cell 302 also has XOR logic 404 comprising four additional devices (e.g., n-FETS) to support the content-searching function.

As shown in FIG. 4, access to each pair of horizontally adjacent CAM cells 302 is provided via word line WL, match lines ML0 and ML1, bit lines BLT0, BLC0, BLT1 and BLC1, local search-data lines MT and MC, and global search-data lines MDLT and MDLC, where each line is either pre-charged high and active low or pre-charged low and active high, depending on the particular design. Horizontal word line WL and match lines ML0/ML1 are shared by each and every pair of cells in the corresponding row. Similarly, vertical bit lines BLT0/BLC0/BLT1/BLC1 are shared by each and every pair of cells in the corresponding column.

Data bits are written into the individual cells of a word in parallel, by activating the word line WL corresponding to the appropriate row and pulsing the appropriate bit line BLT0/1 or BLC0/1 for each column. Pulsing bit line BLT0/1 stores a 1 in the corresponding cell, while pulsing bit line BLC0/1 stores a 0.

Similarly, data bits are read from the individual cells of a word in parallel, by activating the word line WL corresponding to the appropriate row. Each cell in that row will then drive either the BLT0/1 line or the BLC0/1 bit line depending on the value stored in the cell. If the value is 1, then the cell will drive the BLT0/1 bit line; otherwise, the cell will drive the BLC0/1 bit line indicating a bit value of 0.

Figure 5:
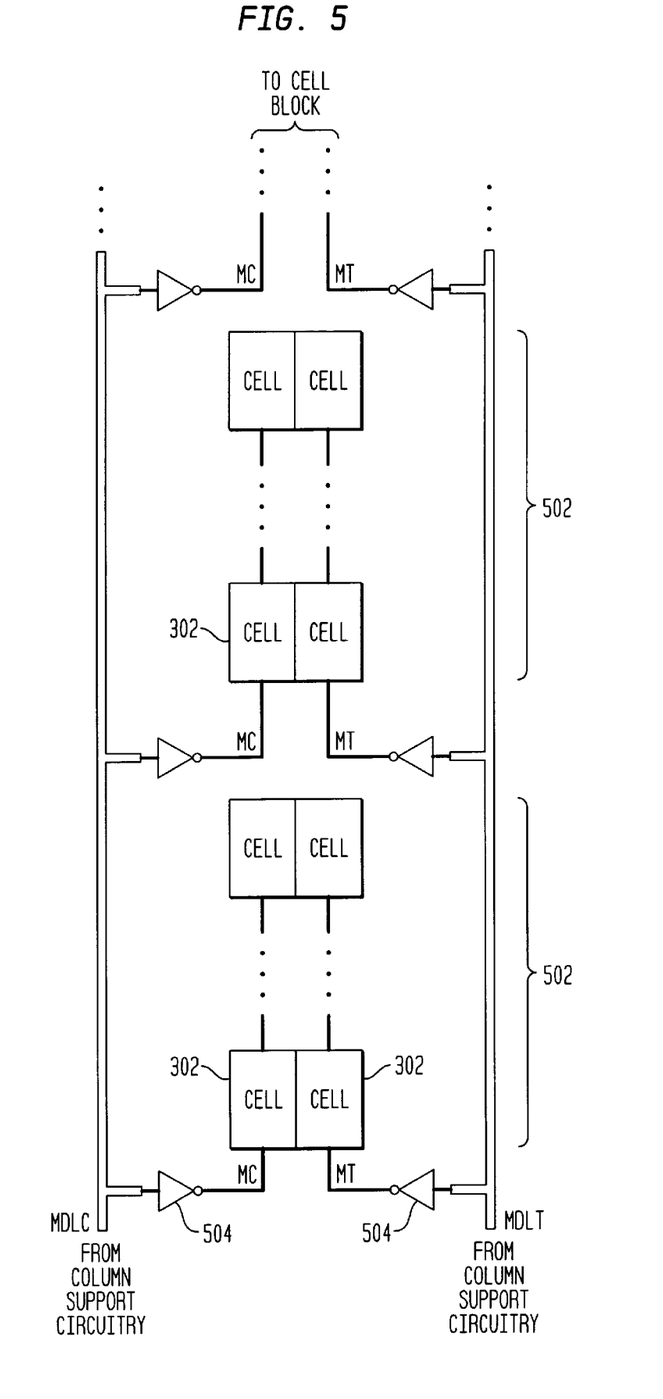
FIG. 5 shows a schematic diagram illustrating the sharing of the local and global search-data lines between pairs of cells in two adjacent columns of cells in the CAM memory of FIG. 3.

FIG. 5 shows a schematic diagram illustrating the sharing of the local and global search-data lines between pairs of cells in two adjacent columns of cells in CAM memory 300 of FIG. 3. As indicated in FIG. 5, each pair of adjacent columns of cells in CAM memory 300 corresponding to the same word bit, as in FIG. 4, is divided into two or more different blocks 502 of cells 302. The cells of each block share the same local search-data lines MT and MC, which are in turn connected to the global search-date lines MDLT and MDLC through a pair of buffers 504. For clarity, the word, match, and bit lines of FIGS. 3 and 4 are not illustrated in FIG. 5.

Since the two cells within each pair of horizontally adjacent cells, as in FIG. 4, share the same local search-data lines, the number of necessary vertical metal channels is reduced by one per cell as compared to the prior-art cells of FIG. 2. This extra vertical metal channel is preferably used for the global search-data lines. The global search-data lines MDLT/MDLC are differential true/complement signals traversing vertically through the array. Periodically throughout the array (i.e., once per cell block in FIG. 5), a gap row is added containing N-well and substrate contacts. This gap row is expanded vertically to include an inverter, buffering the global search-data lines to the local search-data lines MT/MC, which connect to each array cell. The local search-data lines MT/MC are differential true/complement signals that drive the XOR inputs of each array cell. Depending on the particular design, if the global search-data lines are pre-charged high and pulsed low, then the local search-data lines are pre-charged low and pulsed high, or vice versa. The use of global and local search-data lines greatly reduces the loading on the global search-data lines, thereby improving CAM performance with regard to content searching.

Referring again to FIGS. 3 and 4, content searching for CAM memory 300 is achieved using match lines ML0/ML1, local search-data lines MT/MC, and global search-data lines MDLT/MDLC. In particular, one global search-data line is driven for each pair of columns in the array. If the corresponding data bit in the search string is a 1, then the true global search-data line MDLT is driven; otherwise, the complement global search-data line MDLC is driven for a corresponding data bit of 0. Driving a global search-data line (MDLT or MDLC) in turn drives the corresponding local search-data line (MT or MC) for each block of cells in FIG. 5.

Remember that each row of cells in CAM memory 300 corresponds to two different data words, requiring two different match lines (ML0 and ML1) for content searching.

Thus, if any cell in a word does not match its search input bit, then the corresponding match line (ML0 or ML1) will indicate that no match exists for that word. If, however, each bit in the search string matches each corresponding bit in a particular word of the array, then the corresponding match line (ML0 or ML1) is driven indicating that a match has been found at that word. Match line ML0 will indicate a match if each and every odd cell in the row of cells matches the corresponding search bit. Similarly, match line ML1 will indicate a match if each and every even cell in the row of cells matches the corresponding search bit.

As shown in FIG. 3, CAM memory 300 has three horizontal lines (i.e., word line WL and match lines ML0 and ML1) for each row of CAM cells 302. Since each row of CAM cells corresponds to two data words, this means that CAM memory 300 has only three horizontal lines for each pair of data words, as compared to CAM memory 100 of FIG. 1, which required four horizontal lines for each pair of data words. Moreover, CAM memory 300 has six vertical global lines (i.e., bit lines BLT0, BLC0, BLT1, and BLC 1and global search-data lines MDLT and MDLC) for each pair of columns of CAM cells 302, as compared to CAM memory 100 which required eight vertical lines for each pair of columns of CAM cells. Although CAM memory 300 also has two local data lines MT and MC for each cell, they are not global data lines that extend into the support circuitry. As a result, the number of components needed in each set of two-column support circuitry is less than the number of components needed in each two sets of column support circuitry in prior-art CAM memory 100.

Figure 6:
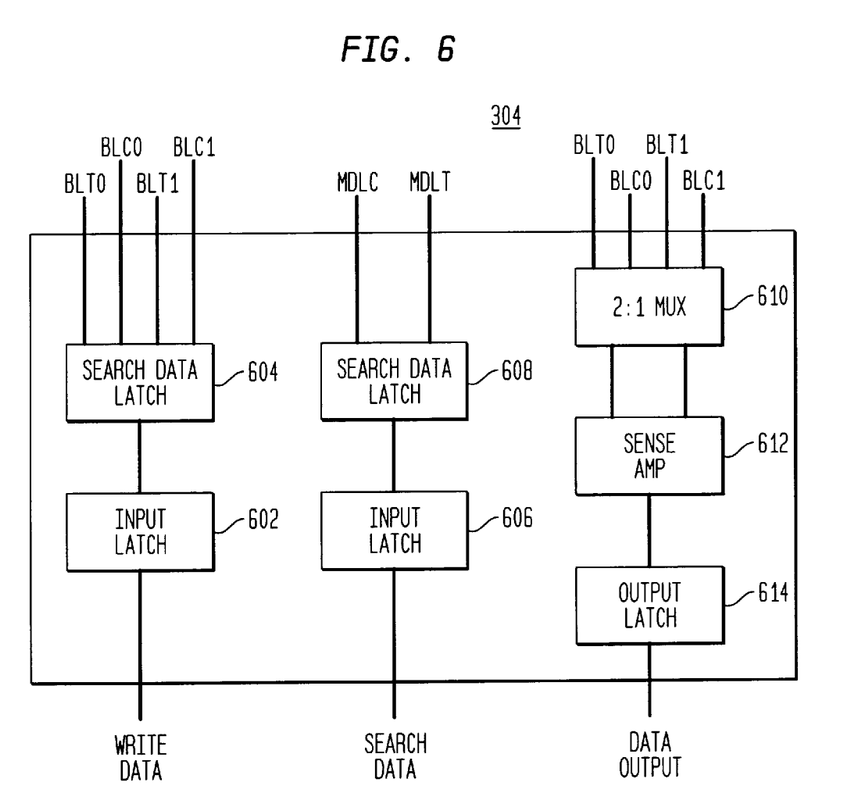
FIG. 6 shows a block diagram of the two-column support circuitry for each pair of columns of cells in the CAM memory of FIG. 3.

FIG. 6 shows a block diagram of the two-column support circuitry 304 for each pair of columns of cells in CAM memory 300, according to one embodiment of the present invention. Two-column support circuitry 304 comprises (a) input latch 602 and write data drivers 604 for receiving write data for transmission along bit lines BLT0/BLC0/BLT1/BLC1, (b) input latch 606 and search data drivers 608 for receiving search data for transmission along global search-data lines MDLC and MDLT, and (c) 2:1 mux 610, sense amp 612, and output latch 614 for receiving read data from bit lines BLT0/BLC0/BLT1/BLC1 for transmission as output data. The presence of 2:1 mux 610, which operates as a column decoder in CAM memory 300, further reduces the number of sense amplifiers in the column support circuitry by a factor of two.

As a result of the previous considerations, the number of components required in each set of row support circuitry and in each set of column support circuitry in CAM memory 300 is less than the number of components required in the comparable sets of row and column support circuitry in CAM memory 100, thereby reducing the layout size for each set of support circuitry. Moreover, the layout for the two-column support circuitry in CAM memory 300 corresponds to the pitch of two columns of cells, thereby enabling a more efficient layout of components in each set of column support circuitry. The size of the cell array itself can be reduced by at least 20% due to better edge-contact sharing of search-data inputs between the pairs of horizontally adjacent cells in the present invention, as compared to the configuration of search-data inputs between the two vertically adjacent cells of the prior art.

The use of 2:1 column muxing reduces the number rows in the array by a factor of two. As such, the amount of capacitive and resistive bit-line loading due to the number of cells in each column is also reduced by a factor of two, resulting is faster array access and therefore better CAM performance. As a result, applications whose performance requirements limited the size of CAM memory (e.g., to 512 words) can now be implemented, according to the present invention, using CAM memory having a larger size (e.g., 1024 words) without sacrificing CAM performance.

Although the present invention has been described in the context of an architecture having both global and local search-data lines, it will be understood that this is an optional feature of the column muxing of the present invention. CAM memory according to the present invention can also be implemented without such an arrangement of global and local search-data lines, relying instead on only global search-data lines as in the prior art. It will also be understood that the column muxing of the present invention can be implemented using ratios greater than 2:1, to achieve even further reduction in bit-line loading.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit having a content-addressable memory (CAM), the CAM comprising:
   (a) an array of CAM cells configured using column muxing such that a bit slice through the array corresponds to k columns of the array and each row of the array corresponds to k words, where k is an integer greater than one;
   (b) a set of row support circuitry for each row in the array; and
   (c) a set of column support circuitry for each k columns in the array.

2. The integrated circuit of claim 1, further comprising a set of column decoders for each set of column support circuitry.

3. The integrated circuit of claim 1, wherein each CAM cell comprises an SRAM core and XOR logic adapted to support content searching.

4. The integrated circuit of claim 1, further comprising:
   one word line and k match lines for each row in the array;
   two bit lines for each column in the array; and
   two global search-data lines for each set of k columns in the array.

5. The integrated circuit of claim 4, further comprising two local search-data lines for each set of k columns in the array, wherein the cells in each set of k columns are divided into two or more blocks of cells and each block of cells has a single connection between each local search-data line and a corresponding global search-data line.

6. The integrated circuit of claim 1, wherein each set of column support circuitry has a layout with a k-column pitch.

7. The integrated circuit of claim 1, wherein the array of CAM cells is configured using 2:1 column muxing and k is 2.

8. The integrated circuit of claim 7, further comprising a set of column decoders for each set of column support circuitry.

9. The integrated circuit of claim 7, wherein each CAM cell comprises an SRAM core and XOR logic adapted to support content searching.

10. The integrated circuit of claim 7, wherein each set of column support circuitry has a layout with a two-column pitch.

11. The integrated circuit of claim 7, further comprising:
   one word line and 2 match lines for each row in the array;

two bit lines for each column in the array; and two global search-data lines for each pair of columns in the array.

12. The integrated circuit of claim 11, further comprising two local search-data lines for each pair of columns in the array, wherein the cells in each pair of columns are divided into two or more blocks of cells and each block of cells has a single connection between each local search-data line and a corresponding global search-data line.

13. The integrated circuit of claim 12, further comprising a set of column decoders for each set of column support circuitry, wherein:

each CAM cell comprises an SRAM core and XOR logic adapted to support content searching; and each set of column support circuitry has a layout with a two-column pitch.

* * * * *